United States Patent [19]

Kabler

[11] Patent Number: 5,126,699
[45] Date of Patent: Jun. 30, 1992

[54] DIGITALLY COMPENSATED MODULATION SYSTEM FOR FREQUENCY SYNTHESIZERS

[75] Inventor: Ronald B. Kabler, Lawrence, Kans.

[73] Assignee: Allied-Signal Inc., Morris Township, Morris County, N.J.

[21] Appl. No.: 766,686

[22] Filed: Sep. 27, 1991

[51] Int. Cl.⁵ .................. H03C 3/08; H03L 1/02; H03L 7/16
[52] U.S. Cl. .................. 332/124; 332/127; 332/128; 331/10; 331/16; 331/66; 331/176
[58] Field of Search ........... 332/124, 126, 127, 128; 331/1 A, 10, 16, 18, 23, 66, 176; 375/120; 445/260

[56] References Cited

U.S. PATENT DOCUMENTS 4,743,867 5/1988 Smith .................. 331/16 X

*Primary Examiner*—David Mis
*Attorney, Agent, or Firm*—Donald B. Paschburg; Howard G. Massung; Robert A. Walsh

[57] ABSTRACT

A digitally compensated modulation system for frequency synthesizers has a single modulation input line with flat frequency response to zero hertz. The above is accomplished while eliminating circuit components and adjustments by integrating reference oscillator temperature compensation, modulation compensation for changes in the voltage controlled oscillator modulation sensitivity and modulation compensation for changes in the reference oscillator modulation sensitivity. Signals requiring modulation enter a microprocessor and are summed together with a microprocessor generated signal and a temperature compensation input to create a composite modulation signal. The composite modulation signal is then multiplied by appropriate constants and sent to the synthesizer.

14 Claims, 4 Drawing Sheets

DIGITALLY COMPENSATED MODULATION SYSTEM FOR FREQUENCY SYNTHESIZERS

BACKGROUND OF THE INVENTION

1. Field of the Invention

The present invention relates to modulation systems and more particularly to digitally compensated modulation systems that provide a single modulation input line with flat frequency response to DC.

2. Description of the Prior Art

There are several digitally compensated modulation systems for frequency synthesizers available in the prior art. All of these modulation systems, however, require complicated connections between modules requiring modulation. Such modules include audio processors, encryption devices, modems, etc.

A typical digitally compensated modulation system of the prior art is shown in FIG. 1. A problem with this implementation is that input signal frequencies below the synthesizer loop bandwidth are rejected.

It is an object of the present invention to simplify connections between these modules, especially when low frequency modulation (below the synthesizer loop bandwidth) or NRZ (non-return-to-zero) schemes are used.

It is another object of the present invention to eliminate components and adjustments by integration of modulation system functions.

SUMMARY OF THE INVENTION

The present invention provides a digitally compensated modulation system for frequency synthesizers having a single modulation input line with flat frequency response to zero hertz (input modulation below the synthesizer loop bandwidth is not attenuated). Also provided is a simple method to sum microprocessor generated signals to externally generated modulation. Internally generated signals may be easily combined with the modulation input signal. The above is provided while eliminating circuit components and adjustments by integrating the following functions: reference oscillator temperature compensation; modulation compensation for changes in the voltage controlled oscillator (VCO) modulation sensitivity as the carrier frequency is changed and due to component tolerances; and, modulation compensation for changes in the reference oscillator modulation sensitivity as the carrier frequency is changed and due to component tolerances.

The present invention comprises a microprocessor, temperature sensor, digital-to-analog convertors, memory, and a low pass filter. Signals requiring modulation enter the microprocessor and are summed together with a microprocessor generated signal and a temperature compensation input to create a composite modulation signal. The composite modulation signal is then multiplied by appropriate constants and sent to the synthesizer. The characteristics of the multipliers are determined by the characteristics of the reference oscillator and the voltage controlled oscillator, both located within the synthesizer.

DETAILED DESCRIPTION OF THE INVENTION

Figure 1:
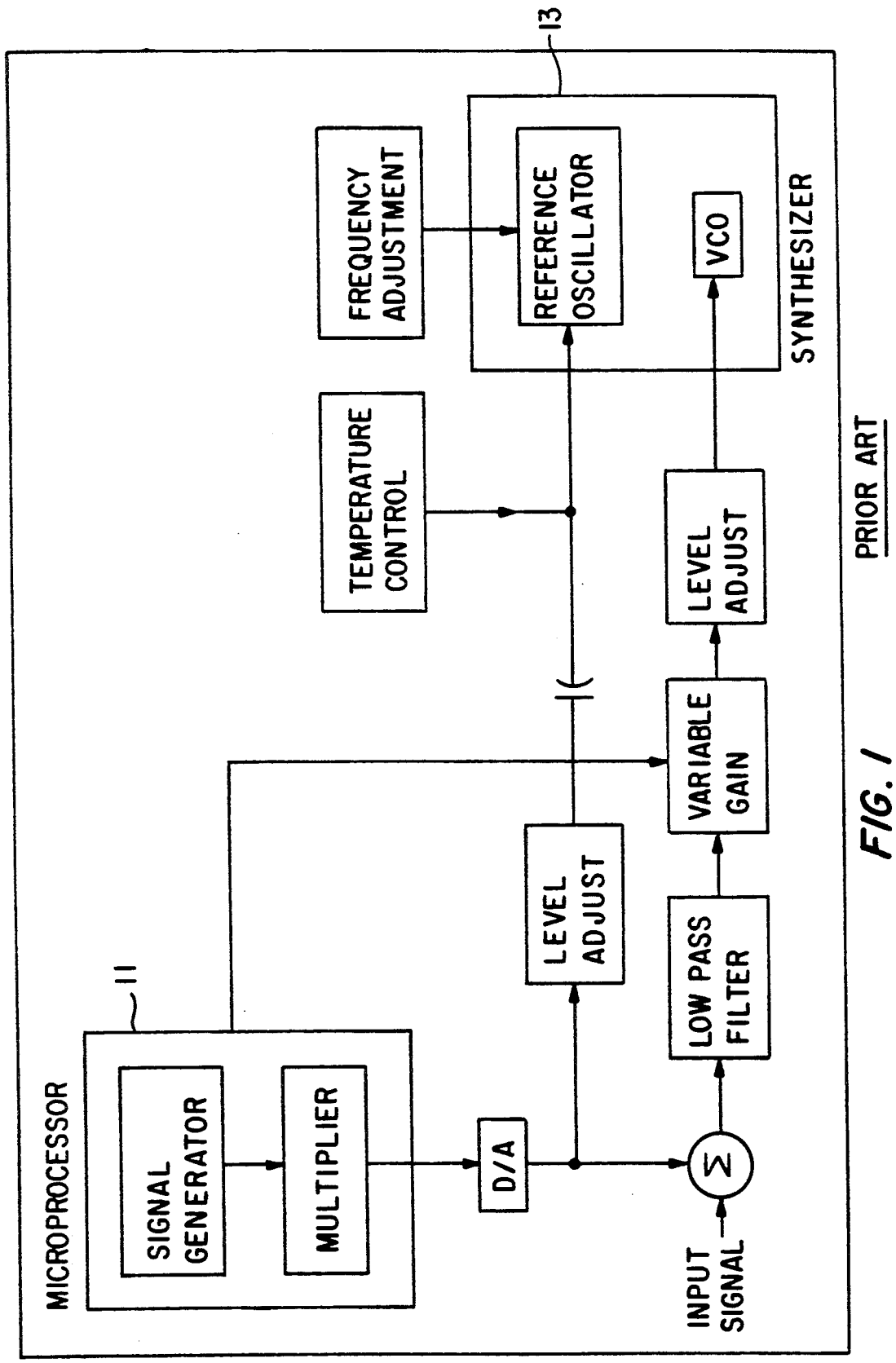
FIG. 1 illustrates a block diagram of a typical digitally compensated modulation system of the prior art.

As discussed in the Description of the Prior Art, FIG. 1 illustrates a typical digitally compensated modulation system of the prior art. In addition to microprocessor 11, several other hardware components are required to interface with synthesizer 13. Besides the complexity of this prior art design, a problem with its implementation is that input signal frequencies below the loop bandwidth of synthesizer 13 are rejected.

Figure 2:
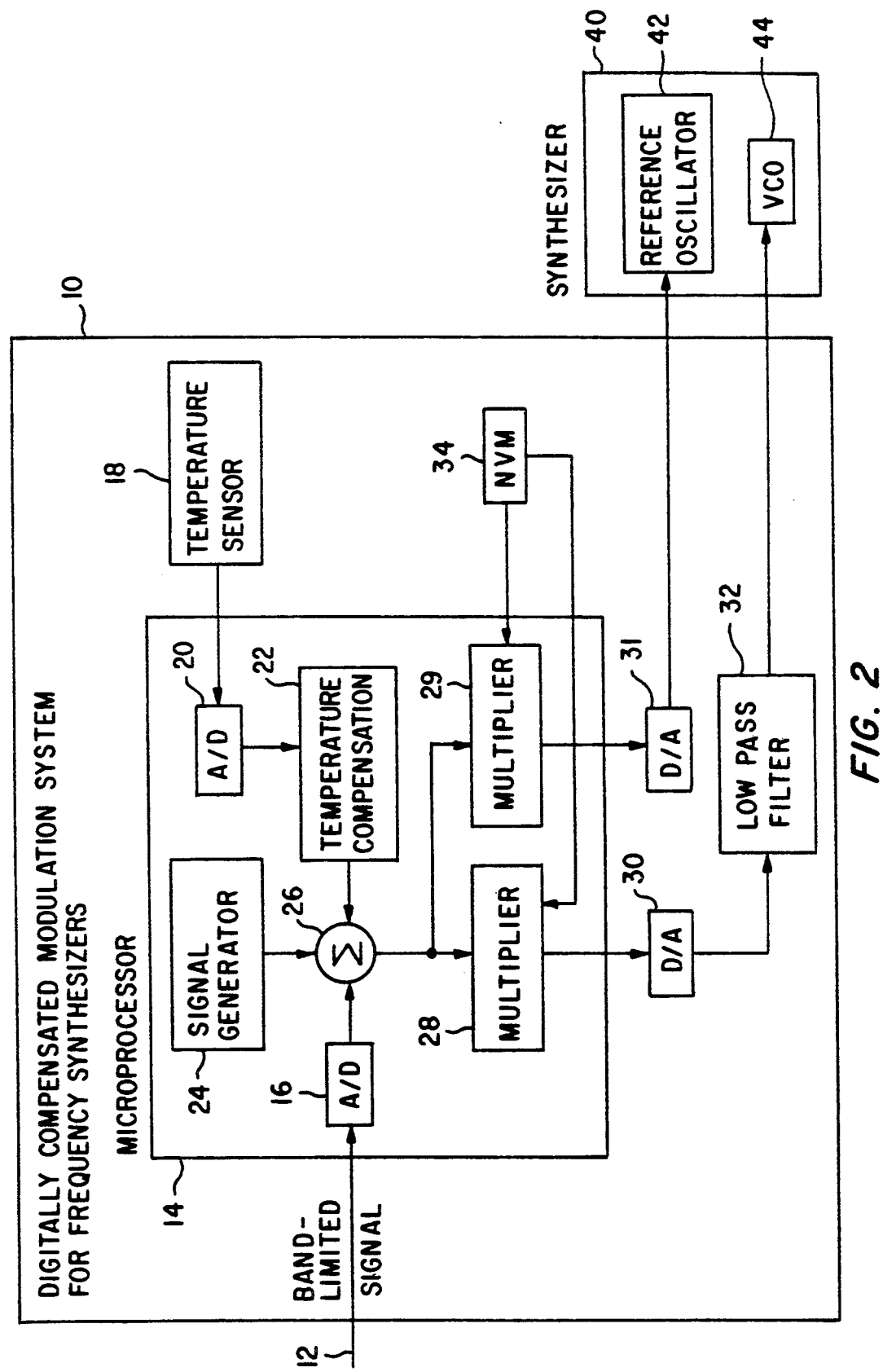
FIG. 2 illustrates a block diagram of one embodiment of the present invention.

FIG. 2 illustrates a block diagram of one embodiment of the present invention that provides modulation of a flat frequency response from zero hertz to an upper limit that is sufficiently below a sampling frequency so as to avoid aliasing. A modulation input signal enters microprocessor 14 of digitally compensated modulation system 10 at band-limited signal input 12. The modulation input signal is band-limited to prevent aliasing. Upon entering microprocessor 14, the modulation input signal is converted to a digital value by analog to digital convertor 16.

A temperature sensor 18 is connected to microprocessor 14 and supplies an analog voltage which is converted to a digital value by analog to digital convertor 20 located within microprocessor 14. This digital value is used by a temperature compensation algorithm 22 to determine what DC value should be added to the modulation so as to maintain the correct carrier frequency. The characteristics of temperature compensation algorithm 22 depend on both the characteristics of temperature sensor 18 and the characteristics of reference oscillator 42 located within synthesizer 40. Assuming temperature sensor 18 provides a linear voltage $V_{temp}$ with temperature, then a third order compensating equation might be used for an AT cut quartz crystal as:

$$V_{comp} = A(V_{temp} - V_{ref})^3 + B(V_{temp} - V_{ref})^2 + C(V_{temp} - V_{ref})$$

wherein $V_{ref}$ is the room temperature reference voltage, and A, B, and C are coefficients which depend on the cut angle of the quartz.

Signal generator 24 internal to microprocessor 14 may be used to provide a microprocessor generated signal as required for tone or digital signaling. A tone or digital modulating signal is often combined with the modulation input signal for use by receivers to determine if transmission is meant for the receivers. A microprocessor generated signal is commonly used for squelch control, selective call, etc.

The digital value of the modulation input signal, the microprocessor generated signal, and the temperature compensation input, enter summation 26 and are summed together to create a composite modulation signal. The composite modulation signal enters two multipliers 28, 29 where the composite modulation signal is multiplied by appropriate constants as derived below. The multiplied output of multiplier 28 then enter D/A convertor 30 and the multiplied output of multiplier 29 enters D/A convertor 31. The analog output of D/A convertor 30 enters low pass filter 32 where the analog output is low pass filtered to eliminate frequency components around the sampling frequency. The filtered output then exits digitally compensated modulation system 10 and travels to voltage controlled oscillator 44 of synthesizer 40. The analog output of D/A convertor 31 exits digitally compensated modulation system 10 and travels to reference oscillator 42 of synthesizer 40. D/A convertor 31, which interfaces with reference oscillator 42, could also be implemented as a pulse width modulator.

The characteristics of multipliers 28, 29 are determined as follows. As digitally compensated modulation system 10 is manufactured, a calibration method is developed to determine what constants are required to produce a certain level of FM deviation at synthesizer 40 at a certain carrier frequency. Both reference oscillator 42 and voltage controlled oscillator 44 must be exercised to develop the calibration method. The values obtained are stored in non-volatile memory 34. During operation, the appropriate multiplier values can be derived by fetching the values stored in non-volatile memory 34 and by modifying the values for the new carrier frequency (carrier frequency that is different from the calibration frequency).

An example of a modification for voltage controlled oscillator 44 is as follows. The carrier frequency of a voltage controlled oscillator can be determined by:

$$f = \frac{1}{2\pi} L^{-\frac{1}{2}} C^{-\frac{1}{2}}$$

The modulation sensitivity can be determined from the derivative as:

$$\frac{df}{dC} = -\frac{1}{4\pi} L^{-\frac{1}{2}} C^{-\frac{3}{2}} = -2\pi^2 f^3 L$$

The modulation change with frequency is given by:

$$\frac{\left(\frac{df}{dC}\right)_2}{\left(\frac{df}{dC}\right)_1} = \frac{-2\pi^2 f_2^3 L_2}{-2\pi^2 f_1^3 L_1} = \left(\frac{f_2}{f_1}\right)^3 \left(\frac{L_2}{L_1}\right)$$

Assuming that $f_1$ is the frequency of calibration and that $f_2$ is the new carrier frequency, a modification to the voltage controlled oscillator value is a multiplication by:

$$\frac{\left(\frac{df}{dC}\right)_1}{\left(\frac{df}{dC}\right)_2} = \left(\frac{f_1}{f_2}\right)^3 \left(\frac{L_1}{L_2}\right)$$

An example of a modification for reference oscillator 42 is as follows. The carrier frequency of synthesizer 40 is related to the frequency of reference oscillator 42 as follows:

$$f = n f_r$$

The modulation sensitivity of synthesizer 40 from the reference oscillator 42 is:

$$\frac{df}{df_r} = n = \frac{f}{f_r}$$

where n is the effective multiplier of reference oscillator 42 to the frequency of synthesizer 40. The change is modulation of synthesizer 40 with frequency is given by:

$$\frac{\left(\frac{df}{df_r}\right)_2}{\left(\frac{df}{df_r}\right)_1} = \frac{n_2}{n_1} = \frac{f_2}{f_1}$$

A modification of the reference oscillator value would therefore be a multiplication by:

$$\frac{\left(\frac{df}{df_r}\right)_1}{\left(\frac{df}{df_r}\right)_2} = \frac{f_1}{f_2}$$

Figure 3:
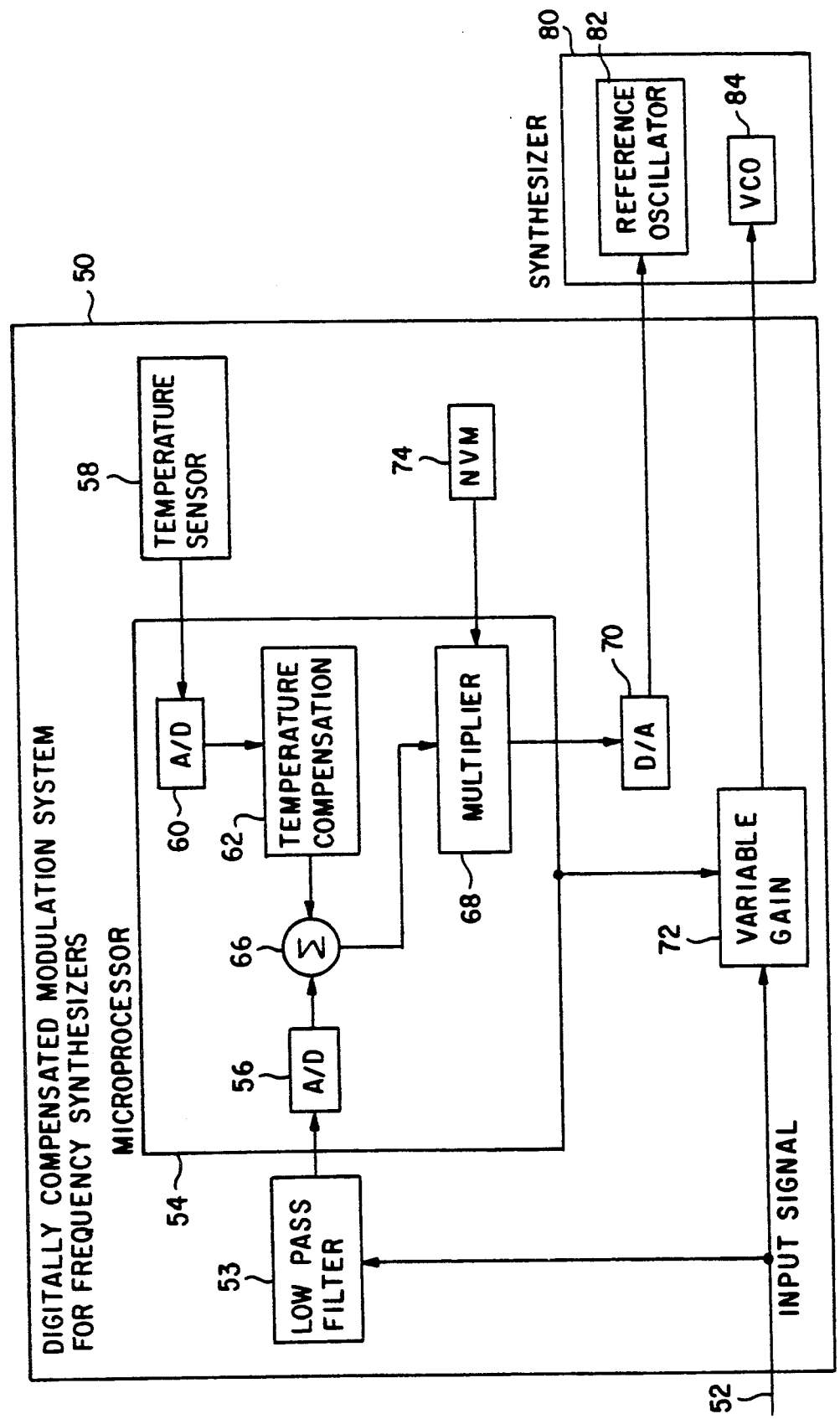
FIG. 3 illustrates a block diagram of another embodiment of the present invention.
Figure 4:
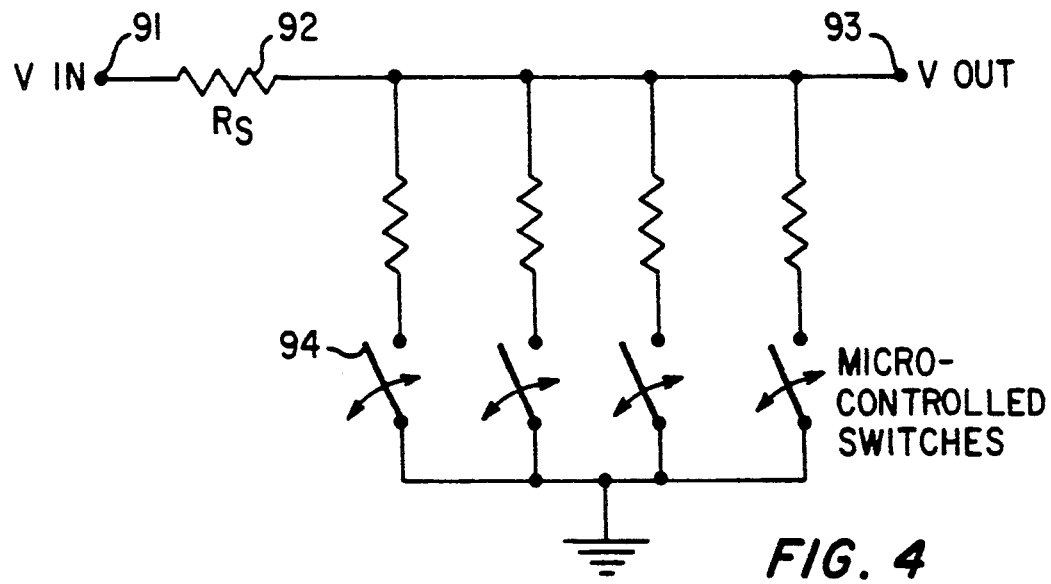
FIG. 4 illustrates a schematic of a microprocessor controlled attenuator as utilized in one embodiment of the present invention.

FIG. 3 illustrates a block diagram of another embodiment of the present invention. This alternate implementation has the advantage of being able to handle a wider bandwidth input signal since the microprocessor is only controlling the gain of the voltage controlled oscillator path (aliasing is no longer a problem). This embodiment has the disadvantage of not allowing internal microprocessor generation of signals. The principles of operation are generally the same except that the multiplier of the high frequency path to the voltage controlled oscillator is accomplished with a microprocessor controlled gain block or resistive attenuator as shown in FIG. 4.

Returning to FIG. 3, a modulation input signal enters digitally compensated modulation system 50 at wide band signal input 52. The modulation input signal then travels through low pass filter 53 and enters microprocessor 54 where the filtered modulation input signal is converted to a digital value by analog to digital convertor 56.

A temperature sensor 58 is connected to microprocessor 54 and supplies an analog voltage which is converted to a digital value by analog to digital convertor 60 located within microprocessor 54. This digital value is used by temperature compensation algorithm 62 to determine what DC value should be added to the modulation so as to maintain the correct carrier frequency. The characteristics of temperature compensation algorithm 62 depend on both the characteristics of temperature sensor 58 and the characteristics of reference oscillator 82 located within synthesizer 80.

The digital value of the filtered modulation input signal and the temperature compensation input, enter summation 66 and are summed together to create a composite modulation signal. The composite modulation signal enters multiplier 68 where the composite modulation signal is multiplied by an appropriate constant. The multiplied output then enters D/A convertor 70. The analog output of D/A convertor 70 exits digitally compensated modulation system 50 and travels to reference oscillator 82 of synthesizer 80. D/A convertor 70, which interfaces with reference oscillator 82, could also be implemented as a pulse width modulator. The characteristics of multiplier 68 are determined by the same technique that is utilized to determine the characteristics of multiplier 29 of the earlier embodiment (FIG. 3).

Microprocessor 54 through its interface with variable gain 72 also controls the gain of the voltage controlled oscillator path. Variable gain 72 receives the modulation input signal and provides for a microprocessor controlled gain to voltage controlled oscillator 84 of synthesizer 80. Variable gain 72 may be a microprocessor controlled gain block or a microprocessor controlled attenuator.

FIG. 4 illustrates a microprocessor controlled attenuator schematic as utilized in one embodiment of the present invention. The modulation input signal enters at Vin 91, passes through Rs 92 and exits at Vout 93. The status of microprocessor controlled switches 94 determines the gain level of the modulation input signal that passes through to the voltage controlled oscillator 84 (FIG. 3).

The present invention provides an efficient method of interfacing a synthesizer with other modulating devices (audio processing modules, encryption devices, modems, etc.) by using a single input line for modulation. By utilizing the present invention, a minimum of several circuit components and two adjustments are eliminated. Accuracy of the reference oscillator of the synthesizer, over temperature, is improved since sophisticated compensation algorithms are derived in software.

It is not intended that this invention be limited to the hardware or software arrangement, or operational procedures shown disclosed. This invention includes all of the alterations and variations thereto as encompassed within the scope of the claims as follows.

I claim:

1. A digitally compensated modulation system for frequency synthesizers comprising:
    single modulation input means for receiving a modulation input signal; and,
    circuitry means for processing said modulation input signal and for providing a flat frequency response to zero hertz.

2. A digitally compensated modulation system for frequency synthesizers as claimed in claim 1 wherein said modulation input signal is band-limited to prevent aliasing.

3. A digitally compensated modulation system for frequency synthesizers as claimed in claim 1 wherein said circuitry means comprises:
    generation means for developing microprocessor generated signals and a temperature compensation input; and,
    summation means for combining said microprocessor generated signals and said temperature compensation input with said modulation input signal.

4. A digitally compensated modulation system for frequency synthesizers as claimed in claim 1 wherein said circuitry means comprises:
    integration means for integrating reference oscillator temperature compensation, modulation compensation for changes in voltage controlled oscillator modulation sensitivity and modulation compensation for changes in reference oscillator modulation sensitivity.

5. A digitally compensated modulation system for frequency synthesizers as claimed in claim 4 wherein changes in voltage controlled oscillator modulation sensitivity occur as carrier frequency is changed and due to component tolerances.

6. A digitally compensated modulation system for frequency synthesizers as claimed in claim 4 wherein changes in reference oscillator modulation sensitivity occur as carrier frequency is changed and due to component tolerances.

7. A digitally compensated modulation system for frequency synthesizers comprising:
    single modulation input means for receiving a modulation input signal;
    temperature sensor means for providing a temperature compensation input; and,
    microprocessor means for generating a microprocessor generated signal, for summing together said modulation input signal, said microprocessor generated signal and said temperature compensation input which provides a composite modulation signal, for multiplying said composite modulation signal and for providing multiplied composite modulation signals.

8. A digitally compensated modulation system for frequency synthesizers as claimed in claim 7 wherein said composite modulation signal is multiplied by appropriate constants before being sent to said frequency synthesizers.

9. A digitally compensated modulation system for frequency synthesizers as claimed in claim 8 wherein said appropriate constants are determined by characteristics of a reference oscillator and characteristics of a voltage controlled oscillator both located within said frequency synthesizers.

10. A digitally compensated modulation system for frequency synthesizers as claimed in claim 7 further comprising:
    digital to analog convertor means for receiving said multiplied composite modulation signals and for providing a first analog output and a second analog output with said first analog output connected to a reference oscillator of said frequency synthesizers.

11. A digitally compensated modulation system for frequency synthesizers as claimed in claim 10 further comprising:
    low pass filter means for receiving said second analog output, for filtering said second analog output and for providing a filtered analog output to a voltage controlled oscillator of said frequency synthesizers.

12. A digitally compensated modulation system for frequency synthesizers as claimed in claim 9 further comprising:
    memory means connected to said microprocessor means for storing said appropriate constants determined by characteristics of said reference oscillator and characteristics of said voltage controlled oscillator both located within said frequency synthesizers and for providing said appropriate constants to said microprocessor means.

13. A method for providing digitally compensated modulation for frequency synthesizers comprising the steps of:
    receiving a modulation input signal on a single modulation input line;
    processing said modulation input signal; and,
    providing a flat frequency response from zero hertz to an upper limit that is sufficiently below a sampling frequency to said frequency synthesizers.

14. A method for providing digitally compensated modulation for frequency synthesizers as claimed in claim 13 wherein processing said modulation input signal comprises the step of:

generating microprocessor generated signals and a temperature compensation input; and,
summing said microprocessor generated signals and said temperature compensation input with said modulation input signal.

* * * * *